US009875966B1

(12) United States Patent
Yang

(10) Patent No.: US 9,875,966 B1
(45) Date of Patent: Jan. 23, 2018

(54) METHOD AND STRUCTURE OF FORMING LOW RESISTANCE INTERCONNECTS

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/225,003

(22) Filed: Aug. 1, 2016

(51) Int. Cl.
| | |
|---|---|
| *H01L 23/528* | (2006.01) |
| *H01L 21/768* | (2006.01) |
| *H01L 23/522* | (2006.01) |
| *H01L 21/283* | (2006.01) |
| *H01L 21/28* | (2006.01) |

(52) U.S. Cl.
CPC .......... *H01L 23/5283* (2013.01); *H01L 21/28* (2013.01); *H01L 21/283* (2013.01); *H01L 21/7684* (2013.01); *H01L 21/76807* (2013.01); *H01L 21/76816* (2013.01); *H01L 21/76843* (2013.01); *H01L 21/76849* (2013.01); *H01L 21/76877* (2013.01); *H01L 21/76883* (2013.01); *H01L 23/522* (2013.01); *H01L 23/528* (2013.01); *H01L 23/5226* (2013.01)

(58) Field of Classification Search
CPC ... H01L 23/52; H01L 23/522; H01L 23/5226; H01L 23/528; H01L 23/5283; H01L 23/532; H01L 23/53209; H01L 23/53214; H01L 23/53228; H01L 21/28; H01L 21/285; H01L 21/28506; H01L 21/2855; H01L 21/28556; H01L 21/283; H01L 21/322; H01L 21/324; H01L 21/44; H01L 24/18; H01L 24/19; H01L 24/20; H01L 24/95; H01L 24/96
See application file for complete search history.

(56) References Cited

U.S. PATENT DOCUMENTS

| | | | | |
|---|---|---|---|---|
| 5,723,367 | A | * | 3/1998 | Wada ............... C23C 14/046 204/192.15 |
| 6,001,461 | A | * | 12/1999 | Toyoda ............ H01L 21/32051 174/258 |
| 6,731,006 | B1 | * | 5/2004 | Halliyal ............ H01L 21/76802 257/750 |
| 7,659,197 | B1 | * | 2/2010 | Juliano ............... H01L 21/2855 204/298.01 |
| 7,964,504 | B1 | * | 6/2011 | Shaviv ............... C23C 14/046 257/E21.17 |
| 8,852,305 | B2 | | 10/2014 | Andersson et al. |
| 8,864,861 | B2 | | 10/2014 | Andersson et al. |
| 8,888,841 | B2 | | 11/2014 | Pandelidis et al. |
| 8,893,711 | B2 | | 11/2014 | Kennedy |
| 8,895,099 | B2 | | 11/2014 | Atanasoska et al. |
| 8,993,472 | B2 | | 3/2015 | Roller et al. |
| 9,005,769 | B2 | | 4/2015 | Lambert et al. |
| 9,017,762 | B2 | | 4/2015 | Rozak et al. |
| 9,023,486 | B2 | | 5/2015 | Nagaraj et al. |
| 9,031,184 | B2 | | 5/2015 | Cabrero et al. |

(Continued)

*Primary Examiner* — Eduardo A Rodela
(74) *Attorney, Agent, or Firm* — Scully, Scott, Murphy & Presser, P.C.; Louis J. Percello, Esq.

(57) ABSTRACT

Low resistance interconnect structures containing a combined via level/line level interconnect structure and an overlying line level interconnect structure are provided in which both interconnect structures include a metal or metal alloy having a bamboo microstructure are provided.

12 Claims, 13 Drawing Sheets

(56) References Cited

U.S. PATENT DOCUMENTS

| | | | |
|---|---|---|---|
| 9,034,465 B2 | 5/2015 | Peters et al. | |
| 9,034,479 B2 | 5/2015 | Nagaraj et al. | |
| 2003/0186543 A1* | 10/2003 | Jiang | H01L 21/76831 |
| | | | 438/687 |
| 2006/0160350 A1* | 7/2006 | Bruley | H01L 21/76829 |
| | | | 438/618 |
| 2012/0319282 A1* | 12/2012 | Uzoh | H01L 21/76883 |
| | | | 257/763 |
| 2013/0015581 A1* | 1/2013 | Wann | H01L 23/53276 |
| | | | 257/751 |
| 2014/0301861 A1 | 10/2014 | Bruce et al. | |
| 2014/0324156 A1 | 10/2014 | Yin et al. | |
| 2015/0069620 A1* | 3/2015 | Chi | H01L 23/5226 |
| | | | 257/774 |
| 2015/0129087 A1 | 5/2015 | Hintz | |
| 2015/0132926 A1 | 5/2015 | D'Evelyn et al. | |
| 2015/0228555 A1* | 8/2015 | Rabie | H01L 23/481 |
| | | | 257/774 |
| 2015/0325522 A1* | 11/2015 | Yeh | H01L 21/2855 |
| | | | 257/741 |
| 2015/0380596 A1* | 12/2015 | Nishii | H01L 31/0749 |
| | | | 438/93 |

\* cited by examiner

METHOD AND STRUCTURE OF FORMING LOW RESISTANCE INTERCONNECTS

BACKGROUND

The present application relates to a semiconductor structure and a method of forming the same. More particularly, the present application relates to a low resistance interconnect structure containing a combined via level/line level interconnect structure and an overlying line level interconnect structure both of which include a metal or metal alloy having a bamboo microstructure. The present application also provides a method of forming the same.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure, which may also be referred to as an interconnect structure, typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias in a dielectric material having a dielectric constant of less than 4.0.

As the dimensions of the interconnect structures become smaller, the resistivity of the interconnect structures increases dramatically. This becomes a challenge for the development of current and future semiconductor nodes. As such, there is a need for providing interconnect structures having low resistance which can be used in today's and future semiconductor technology nodes.

SUMMARY

Low resistance interconnect structures containing a combined via level/line level interconnect structure and an overlying line level interconnect structure are provided in which both interconnect structures include a metal or metal alloy having a bamboo microstructure. The bamboo microstructure of the interconnect structures of the present application is superior to a polycrystalline microstructure that is present in existing interconnect structures. Notably, a bamboo microstructure may provide enhanced mechanical and electrical properties as compared to an interconnect structure that contains a polycrystalline microstructure which can lead to a low resistance interconnect structure.

In one aspect of the present application, a semiconductor structure is provided. In one embodiment of the present application, the semiconductor structure includes a combined via level/line level interconnect structure embedded in a first interconnect dielectric material layer. The structure further includes a line level interconnect structure embedded at least in part in a second interconnect dielectric material layer and located on at least a portion of the combined via level/line level interconnect structure. In accordance with the present application, the combined via level/line level interconnect structure comprises a first conductive metal or metal alloy having a bamboo microstructure, and the line level interconnect structure comprises a second conductive metal or metal alloy having a bamboo microstructure.

In another aspect of the present application, a method of forming a semiconductor structure is provided. In one embodiment of the present application, the method may include forming a combined via level/line level interconnect structure embedded in a first interconnect dielectric material layer. Next, a line level interconnect structure which is embedded at least in part in a second interconnect dielectric material layer and is located on at least a portion of the combined via level/line level interconnect structure is formed. In accordance with the present application, the combined via level/line level interconnect structure comprises a first conductive metal or metal alloy having a bamboo microstructure, and the line level interconnect structure comprises a second conductive metal or metal alloy having a bamboo microstructure.

DETAILED DESCRIPTION

Figure 1:
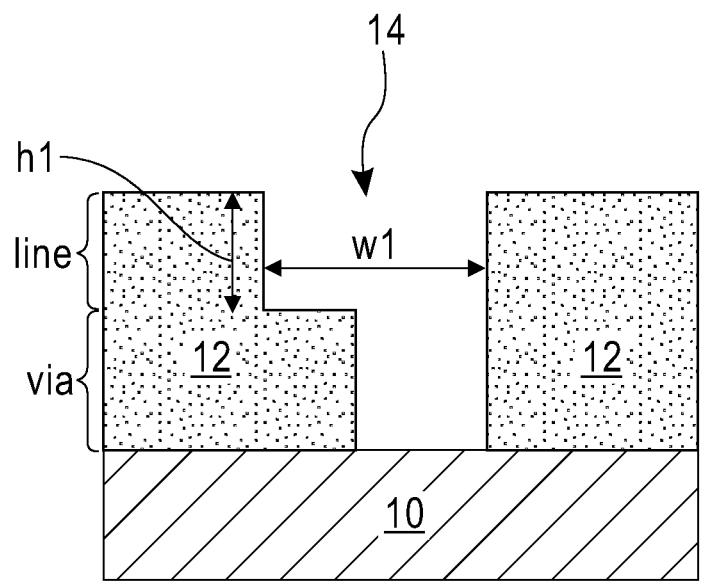
FIG. 1 is a cross sectional view of an exemplary semiconductor structure including a first interconnect dielectric material layer having a dual damascene opening and located on a surface of a substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including a first interconnect dielectric material layer 12 having a dual damascene opening 14 that can be employed in accordance with an embodiment of the present application. As is shown, the first interconnect dielectric material layer 12 is located on a surface of a substrate 10, and the dual damascene opening 14 includes a combined via opening (labeled as 'via' in the drawings) and line opening (labeled as 'line' in the drawings); the via opening and the line opening are in communication with each other. As is known to those skilled in the art, a via opening has a width that is greater than a width of a line opening. Although the present application describes and illustrates a single dual damascene opening 14 formed into the first interconnect dielectric material layer 12, a plurality of spaced apart dual damascene openings can be formed into the first interconnect dielectric material layer 12.

The substrate 10 that can be employed in the present application may be composed of a semiconductor material, an insulator material, a conductive material or any combination thereof. When the substrate 10 is composed of a semiconductor material, any material having semiconducting properties such as, for example, Si, SiGe, SiGeC, SiC, Ge, III/V compound semiconductors or II/VI compound semiconductors, may be used. In addition to these listed types of semiconductor materials, the substrate 10 can be a layered semiconductor such as, for example, Si/SiGe, Si/SiC, silicon-on-insulators (SOIs) or silicon germanium-on-insulators (SGOIs).

When the substrate 10 is an insulator material, the insulator material can be an organic insulator, an inorganic insulator or any combination thereof including multilayers. When the substrate 10 is a conductive material, the substrate may include, for example, polySi, an elemental metal, alloys of elemental metals, a metal silicide, a metal nitride or any combination thereof including multilayers.

When the substrate 10 is composed of a semiconductor material, one or more semiconductor devices such as, for example, complementary metal oxide semiconductor (CMOS) devices can be fabricated thereon. When the substrate 10 is composed of a combination of an insulator material and a conductive material, the substrate 10 may represent an underlying interconnect level of a multilayered interconnect structure.

The first interconnect dielectric material layer 12 that is employed in the present application may be composed of any interlevel or intralevel dielectric including inorganic dielectrics or organic dielectrics. In one embodiment, the first interconnect dielectric material layer 12 may be non-porous. In another embodiment, the first interconnect dielectric material layer 12 may be porous. Some examples of suitable dielectrics that can be used as the first interconnect dielectric material layer 12 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first interconnect dielectric material layer 12 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the first interconnect dielectric material layer 12 may vary depending upon the type of dielectric material(s) used. In one example, the first interconnect dielectric material layer 12 may have a thickness from 50 nm to 1000 nm. Other thicknesses that are lesser than, or greater than, the aforementioned thickness range may also be employed in the present application for the thickness of first interconnect dielectric material layer 12.

The dual damascene opening 14 that is formed into the first interconnect dielectric material layer 12 can be formed by forming either the line opening or the via opening first, and thereafter forming the other of the line opening or via opening not previously formed. The line opening and the via opening may be formed utilizing a patterning process. In one embodiment, the patterning process may include lithography and etching. The lithographic process includes forming a photoresist (not shown) atop the first interconnect dielectric material layer 12, exposing the photoresist to a desired pattern of radiation and developing the exposed photoresist utilizing a conventional resist developer. The photoresist may be a positive-tone photoresist, a negative-tone photoresist or a hybrid-tone photoresist. In some embodiments, a hard mask such as, for example, a layer of silicon dioxide and/or silicon nitride, can be interposed between the photoresist and the first interconnect dielectric material layer 12. The etching process includes a dry etching process (such as, for example, reactive ion etching, ion beam etching, plasma etching or laser ablation), and/or a wet chemical etching process. Typically, reactive ion etching is used in providing the dual damascene opening 14 into at least the first interconnect dielectric material layer 12. In some embodiments, the etching process includes a first pattern transfer step in which the pattern provided to the photoresist is transferred to the hard mask, the patterned photoresist is then removed by an ashing step, and thereafter, a second pattern transfer step is used to transfer the pattern from the patterned hard mask into the underlying first interconnect dielectric material layer 12. In the present application, the dual damascene opening 14 is formed utilizing at least one iteration of the above mentioned lithography and etching steps.

The depth of the dual damascene opening 14 that is formed into the first interconnect dielectric material layer 12 (measured from the topmost surface of the first interconnect dielectric material layer 12 to the bottom wall of the dual damascene opening 14) may vary. In some embodiments, the dual damascene opening 14 may extend entirely through the first interconnect dielectric material layer 12. In yet other embodiments, the dual damascene opening 14 stops within the first interconnect dielectric material layer 12 itself. In yet further embodiments, different depth dual damascene openings 14 can be formed into the first interconnect dielectric material layer 12.

In the present application, the line opening of the dual damascene opening 14 has an aspect ratio (height, h1, to width, w1) of less than 2.5. In one example, the aspect ratio of the line opening of the dual damascene opening 14 is from 0.3 to 2.0.

Figure 2:
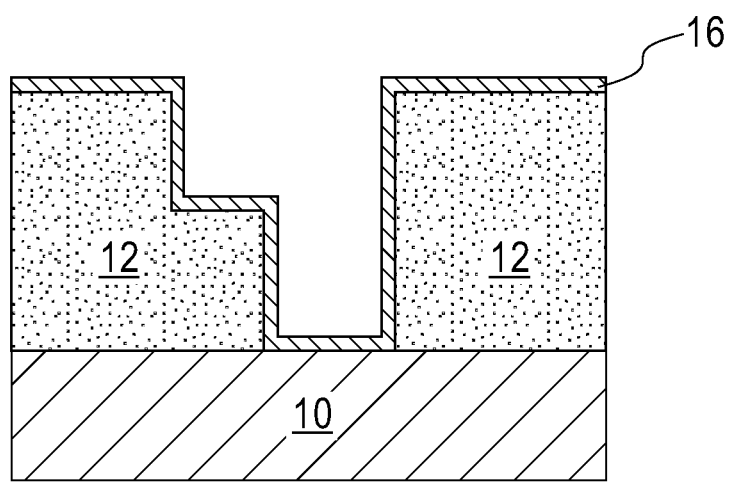
FIG. 2 is a cross sectional view of the exemplary semiconductor structure of FIG. 1 after forming a continuous layer of a first diffusion barrier material.

Referring now to FIG. 2, there is illustrated the exemplary semiconductor structure of FIG. 1 after forming a continuous layer of a first diffusion barrier material 16. The continuous layer of the first diffusion barrier material 16 is formed on the topmost surface of the first interconnect dielectric material layer 12 and lines the entirety of the dual damascene opening 14.

The continuous layer of the first diffusion barrier material 16 includes any diffusion barrier material or stack of diffusion barrier materials that can serve as a barrier to prevent a conductive material from diffusing there through. Illustrative examples of diffusion barrier materials that can provide the continuous layer of the first diffusion barrier material 16 include, but are not limited to, Ta, TaN, Ti, TiN, Ru, RuN, Co, CoN, RuTa, RuTaN, W, or WN. The thickness of the continuous layer of the first diffusion barrier material 16 may vary depending on the deposition process used as well as the type of diffusion material employed. In some embodiments, the continuous layer of the first diffusion barrier material 16 may have a thickness from 2 nm to 50 nm; although other thicknesses for the continuous layer of the first diffusion barrier material 16 are contemplated and can be employed in the present application. The continuous layer of the first diffusion barrier material 16 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the continuous layer of the first diffusion barrier material 16. The optional plating seed layer is also a continuous layer. The optional plating seed layer is employed to selectively promote subsequent electroplating of a pre-selected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed. The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

Figure 3:
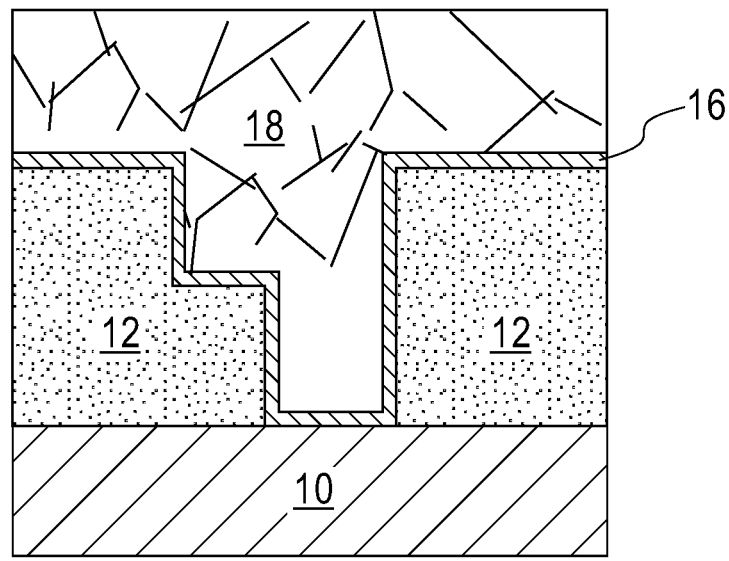
FIG. 3 is a cross sectional view of the exemplary semiconductor structure of FIG. 2 after forming a first conductive metal or metal alloy having a polycrystalline microstructure.

Referring now to FIG. 3, there is illustrated the exemplary semiconductor structure of FIG. 2 after forming a first conductive metal or metal alloy having a polycrystalline microstructure; the first conductive metal or metal alloy having the polycrystalline microstructure is labeled as element 18 in FIG. 3. By "polycrystalline microstructure" it is meant a material that is composed of a random matrix of multiple small crystals rather than one single large crystal. The small crystals providing the polycrystalline microstructure are variously oriented. The first conductive metal or metal alloy having the polycrystalline microstructure is formed in a remaining volume of the dual damascene opening 14 and above the topmost surface of the first interconnect dielectric material layer 12.

The first conductive metal or metal alloy having the polycrystalline microstructure may be composed of, for example, Cu, Al, W, Co, Ru, Rh, Ni or alloys thereof such as, for example, Cu—Al or Al—Cu; notably, the first conductive metal or metal alloy must be composed of a different metal or metal alloy than the first diffusion barrier material mentioned above. The first conductive metal or metal alloy having the polycrystalline microstructure may be formed by a deposition process including chemical vapor deposition (CVD), plasma enhanced chemical vapor deposition (PECVD), sputtering, chemical solution deposition or plating. In one embodiment, a bottom-up plating process is employed in forming first conductive metal or metal alloy having the polycrystalline microstructure.

Figure 4:
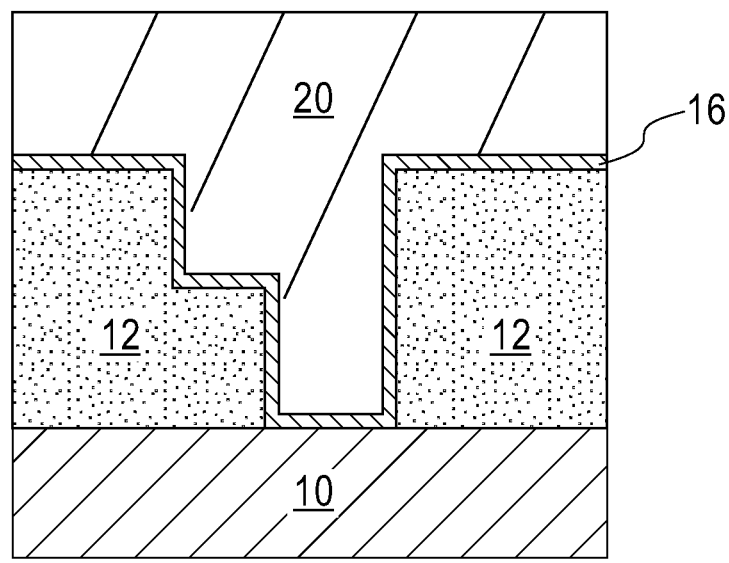
FIG. 4 is a cross sectional view of the exemplary semiconductor structure of FIG. 3 after performing an anneal to convert the polycrystalline microstructure of the first conductive metal or metal alloy into a bamboo microstructure.

Referring now to FIG. 4, there is illustrated the exemplary semiconductor structure of FIG. 3 after performing an anneal to convert the polycrystalline microstructure of the first conductive metal or metal alloy into a bamboo microstructure. In FIG. 4, element 20 denotes a first conductive metal or metal alloy having the bamboo microstructure. By "bamboo microstructure" it is meant a material that is composed of a matrix of multiple crystals, in which the grain boundaries are oriented in a same direction (i.e., parallel) or substantially the same direction (±10 percent from parallel). In some embodiment of the present application and as is shown in the drawings, the bamboo microstructure is nearly columnar.

In one embodiment of the present application, the anneal used to convert from a polycrystalline microstructure into a bamboo microstructure may be a thermal anneal. In one embodiment of the present application, the thermal anneal may be performed at a temperature from 100° C. to 500° C. Other thermal annealing temperatures can also be used in the present application as long as the temperature of the thermal anneal performs the above mentioned conversion. The thermal anneal may be performed in an inert ambient including, for example, helium (He), argon (Ar), neon (Ne), or mixtures thereof. The duration of the thermal anneal employed in the present application to perform the conversion from a polycrystalline microstructure into a bamboo microstructure may vary. In one example, the thermal anneal may be performed for a duration from 30 minutes to 10 hours. The thermal anneal may include a furnace anneal or a rapid thermal anneal.

In another embodiment, the anneal used to convert from a polycrystalline microstructure into a bamboo microstructure may be a laser anneal. In one embodiment of the present application, the laser anneal may be performed at a temperature from 200° C. to 1000° C. Other laser annealing temperatures can also be used in the present application as long as the temperature of the laser anneal performs the above mentioned conversion. The laser anneal may include any type of laser such as, for example, single-beam, dual-beam or multiple-beam systems. The duration of the laser anneal employed in the present application to perform the conversion from a polycrystalline microstructure into a bamboo microstructure may vary. In one example, the laser anneal may be performed for a duration from 10 nanoseconds to 5 minutes.

Figure 5:
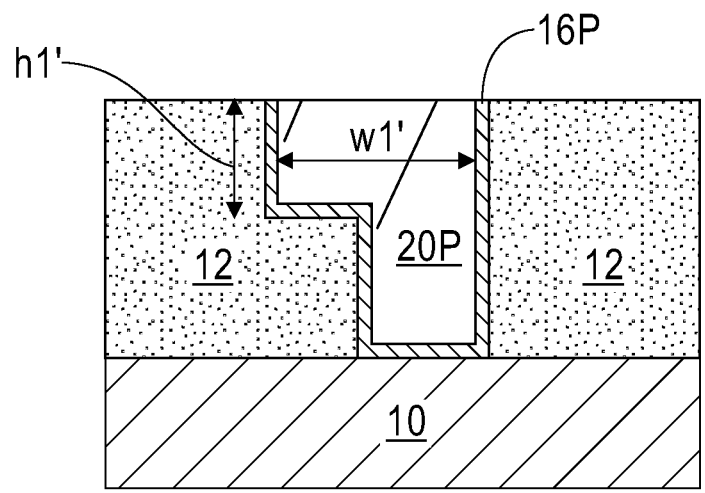
FIG. 5 is a cross sectional view of the exemplary semiconductor structure of FIG. 4 after performing a planarization process.

Referring now to FIG. 5, there is illustrated the exemplary semiconductor structure of FIG. 4 after performing a planarization process. The planarization process may include chemical mechanical polishing (CMP) and/or grinding. The planarization process removes all material that is present outside of the dual damascene opening 14 and located above the topmost surface of the first interconnect dielectric material layer 12. The planarization process provides a combined via level/line level interconnect structure 20P embedded in the first interconnect dielectric material layer 12. As is shown, the topmost surface of the combined via level/line level interconnect structure 20P is coplanar with a topmost surface of the first interconnect dielectric material layer 12. The combined via level/line level interconnect structure 20P is composed of a remaining portion of the first conductive metal or metal alloy having the bamboo microstructure mentioned above. The aspect ratio of the line level component of the combined via level/line level interconnect structure 20P, h1'/w1', is equal to or less than the original aspect ratio shown in FIG. 1 due to possible height loss during the planarization process.

In FIG. 5, element 16P denotes a remaining portion of the continuous layer of the first diffusion barrier material 16. The remaining portion of the continuous layer of the first diffusion barrier material 16 may be referred to as a first diffusion barrier liner 16P. The first diffusion barrier liner 16P continuously lines the dual damascene opening 14.

Figure 6:
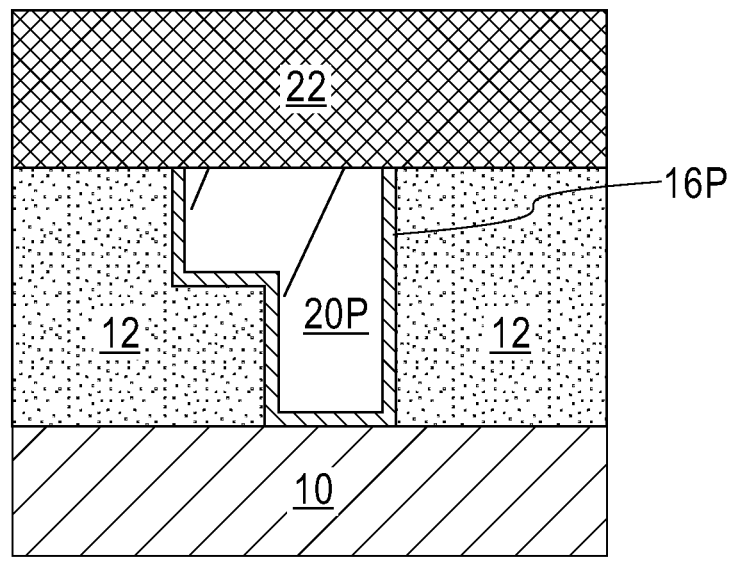
FIG. 6 is a cross sectional view of the exemplary semiconductor structure of FIG. 5 after forming a second interconnect dielectric material layer on the planarized semiconductor structure.

Referring now to FIG. 6, there is illustrated the exemplary semiconductor structure of FIG. 5 after forming a second interconnect dielectric material layer 22 on the planarized semiconductor structure. That is, the second interconnect dielectric material layer 22 is formed on exposed portions of the topmost surface of the first interconnect dielectric material layer 12, on exposed surfaces of the topmost surface of the first diffusion barrier liner 16P, and an exposed surface of the combined via level/line level interconnect structure 20P having the bamboo microstructure.

The second interconnect dielectric material layer 22 may include one of the dielectric materials mentioned above for the first interconnect dielectric material layer 12. In one embodiment of the present application, the dielectric material that provides the second interconnect dielectric material layer 22 is a same dielectric material as that which provides the first interconnect dielectric material layer 12. In such an embodiment, no material interface is present between the first and second interconnect dielectric material layers (12, 22). In another embodiment of the present application, the dielectric material that provides the second interconnect dielectric material layer 22 is a different dielectric material than that which provides the first interconnect dielectric material layer 12. In such an embodiment, a material interface is present between the first and second interconnect dielectric material layers (12, 22).

The second interconnect dielectric material layer 22 may be formed utilizing one of the deposition processes as mentioned above in providing the first interconnect dielectric material layer 12. The second interconnect dielectric material layer 22 may have a thickness from 50 nm to 800 nm; although other thicknesses are possible can be used in the present application.

Figure 7A:
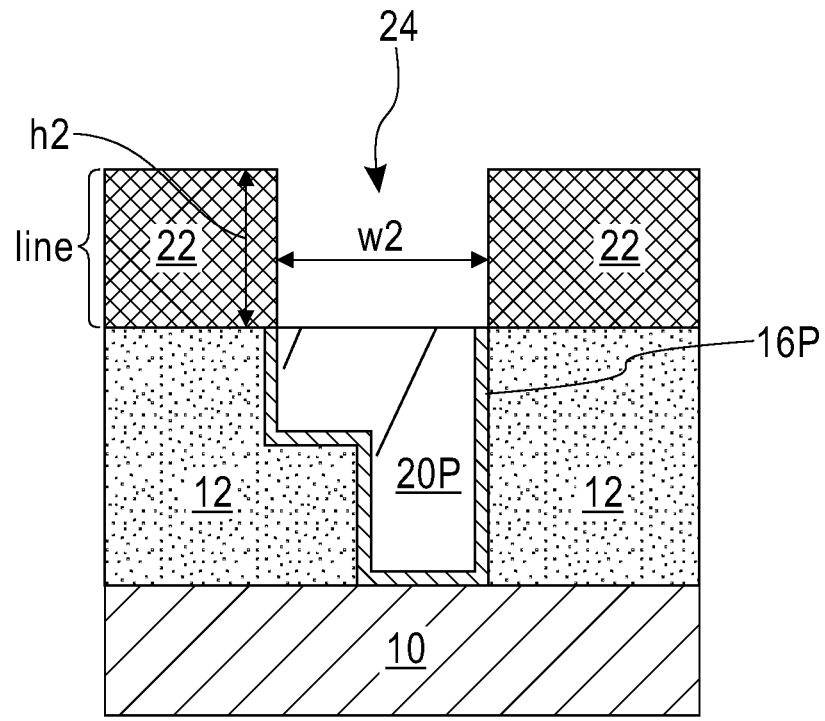
FIG. 7A is a cross sectional view of the exemplary semiconductor structure of FIG. 6 after forming a line opening in the second interconnect dielectric material layer in which the line opening is perfectly aligned to an underlying first conductive metal or metal alloy structure having the bamboo microstructure.
Figure 7B:
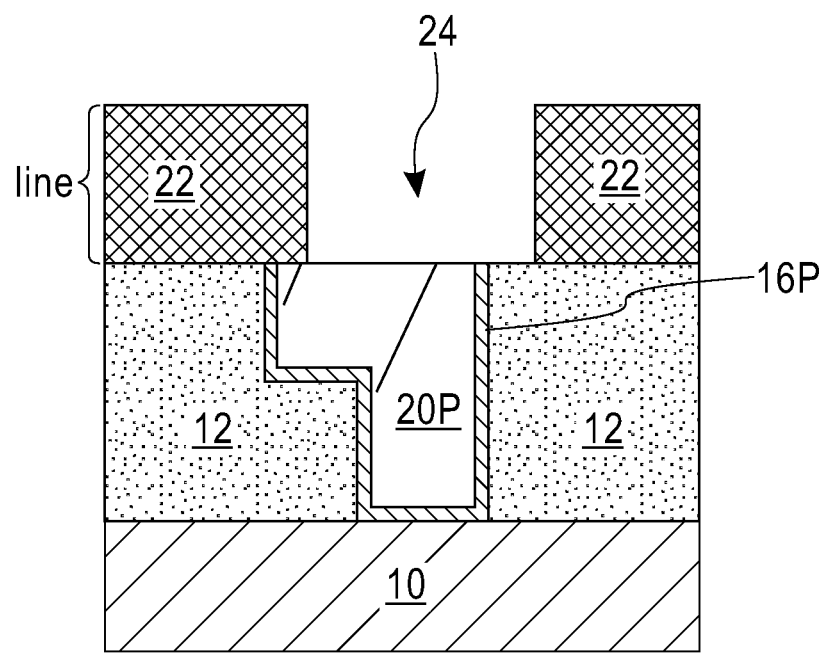
FIG. 7B is a cross sectional view of the exemplary semiconductor structure of FIG. 6 after forming a line opening in the second interconnect dielectric material layer in which the line opening is misaligned to an underlying first conductive metal or metal alloy structure having the bamboo microstructure.

Referring now to FIG. 7A, there is illustrated the exemplary semiconductor structure of FIG. 6 after forming a line opening 24 in the second interconnect dielectric material layer 22 in which the line opening 24 is perfectly aligned to an underlying first conductive metal or metal alloy structure having the bamboo microstructure (i.e., the combined via level/line level interconnect structure 20P). By "perfectly aligned to" it is meant that the line opening 24 does not expose any portion of the first interconnect dielectric material layer 12. FIG. 7B shows the exemplary semiconductor structure of FIG. 6 after forming a line opening 24 in the second interconnect dielectric material layer 22 in which the line opening 24 is misaligned to the underlying first conductive metal or metal alloy structure having the bamboo microstructure (i.e., the combined via level/line level interconnect structure 20P). In the misaligned embodiment, the line opening 24 exposes a topmost surface of the first interconnect dielectric material layer 12 that is located immediately adjacent the combined via level/line level interconnect structure 20P.

In either embodiment, the line opening 24 has an aspect ratio (ratio of the second height, h2, to second width, w2) of less than 2.5; h2 is the height, i.e., thickness, of the second interconnect dielectric material layer 22. In one example, the aspect ratio of the line opening 24 is from 0.3 to 2.0. The line opening 24 can be formed by the patterning process mentioned above in forming the dual damascene opening 14 without a second iteration of lithography and etching.

Figure 8:
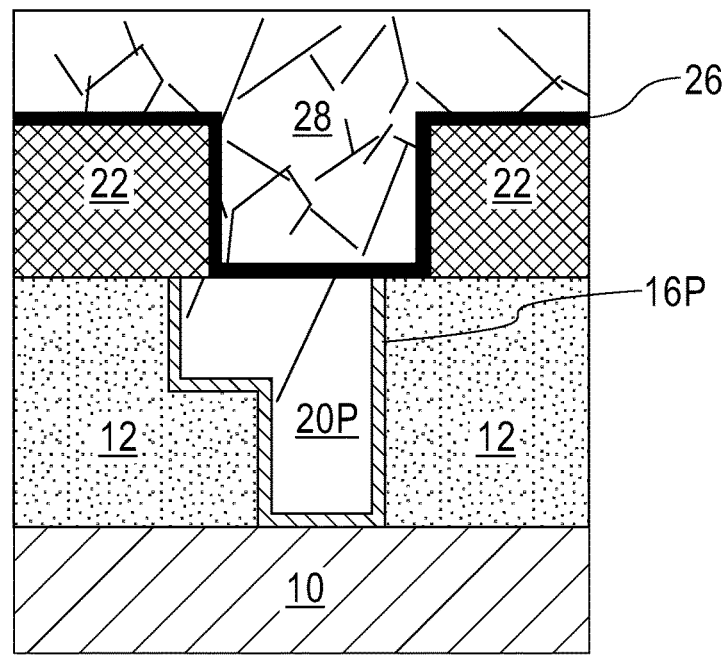
FIG. 8 is a cross sectional view of the exemplary semiconductor structure of FIG. 7B after forming a continuous layer of a second diffusion barrier material and a second conductive metal or metal alloy having a polycrystalline microstructure.

Referring now to FIG. 8, there is illustrated the exemplary semiconductor structure of FIG. 7B after forming a continuous layer of a second diffusion barrier material 26 and a second conductive metal or metal alloy having a polycrystalline microstructure; element 28 denotes the second conductive metal or metal alloy having the polycrystalline microstructure. The continuous layer of the second diffusion barrier material 26 and the second conductive metal or metal alloy having the polycrystalline microstructure are formed into the line opening 24 and above a topmost surface of the second interconnect dielectric material layer 22.

Although the continuous layer of the second diffusion barrier material 26 and the second conductive metal or metal alloy having the polycrystalline microstructure are shown as being formed on the exemplary semiconductor structure of FIG. 7B, the continuous layer of the second diffusion barrier material 26 and the second conductive metal or metal alloy having the polycrystalline microstructure can be formed on the exemplary semiconductor structure shown in FIG. 7A.

The continuous layer of the second diffusion barrier material 26 may include one of the diffusion barrier materials mentioned above for the continuous layer of the first diffusion barrier material 16. In one embodiment, the diffusion barrier material that provides the continuous layer of the second diffusion barrier material 26 may be a same diffusion barrier material as that used to provide the continuous layer of the first diffusion barrier material 16. For example, the continuous layers of the first and second diffusion barrier materials (16, 26) may be both composed of Ti, TiN, Ta, or TaN. In another embodiment, the diffusion barrier material that provides the continuous layer of the second diffusion barrier material 26 may be a different diffusion barrier material than that used to provide the continuous layer of the first diffusion barrier material 16. For example, the continuous layer of the second diffusion barrier material 26 may be composed of TiN, while the continuous layer of the first diffusion barrier material 16 may be composed of TaN.

The continuous layer of the second diffusion barrier material 26 may be formed utilizing one of the deposition processes mentioned above in forming the continuous layer of the first diffusion barrier material 16. The continuous layer of the second diffusion barrier material 26 may have a thickness within the thickness range mentioned above for the continuous layer of the first diffusion barrier material 16.

The second conductive metal or metal alloy having the polycrystalline microstructure (i.e., element 28 shown in FIG. 8) may include one of the conductive metals or metal alloys mentioned above for the first conductive metal or metal alloy having the polycrystalline microstructure (i.e., element 18 shown in FIG. 3). In one embodiment, the second conductive metal or metal alloy having the polycrystalline microstructure is composed of same conductive metal or metal alloy as the first conductive metal or metal alloy having the polycrystalline microstructure. For example, Cu or a Cu—Al alloy can be used as the first and second conductive metals or metal alloys having the polycrystalline microstructure. In another embodiment of the present application, the second conductive metal or metal alloy having the polycrystalline microstructure is composed of different conductive metal or metal alloy than the first conductive metal or metal alloy having the polycrystalline microstructure. For example, Cu can be used as the first conductive metal or metal alloy having the polycrystalline microstructure, while W can be used as the second conductive metal or metal alloy having the polycrystalline microstructure.

The second conductive metal or metal alloy having the polycrystalline microstructure can be formed utilizing one of the deposition processes mentioned above in forming the first conductive metal or metal alloy having the polycrystalline microstructure.

Figure 9:
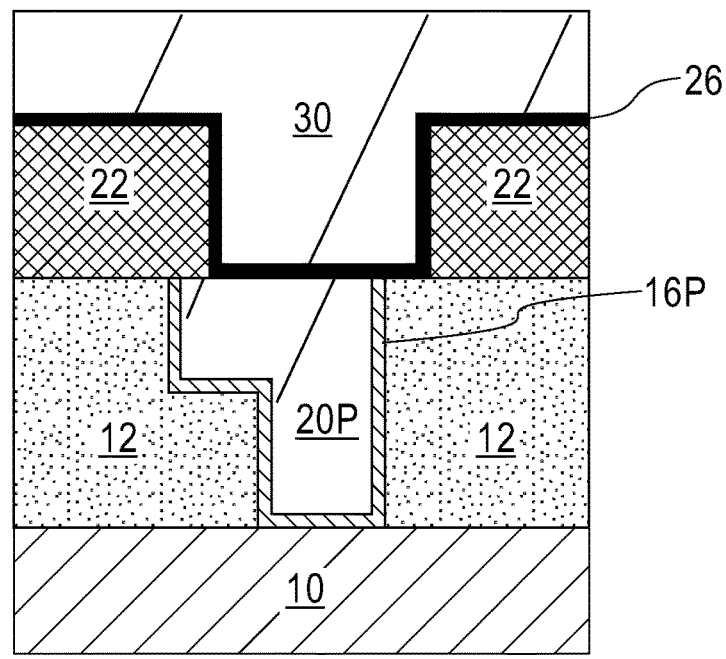
FIG. 9 is a cross sectional view of the exemplary semiconductor structure of FIG. 8 after performing an anneal to convert the polycrystalline microstructure of the second conductive metal or metal alloy into a bamboo microstructure.

Referring now to FIG. 9, there is illustrated the exemplary semiconductor structure of FIG. 8 after performing an anneal to convert the polycrystalline microstructure of the second conductive metal or metal alloy into a bamboo microstructure. In FIG. 9, element 30 denotes the second conductive metal or metal alloy that has the bamboo microstructure. The anneal used in this step of the present application may include one of the anneals (i.e., thermal or laser) mentioned above. The anneal used in this step need not be the same as the anneal used in the previously mentioned conversion step.

Figure 10:
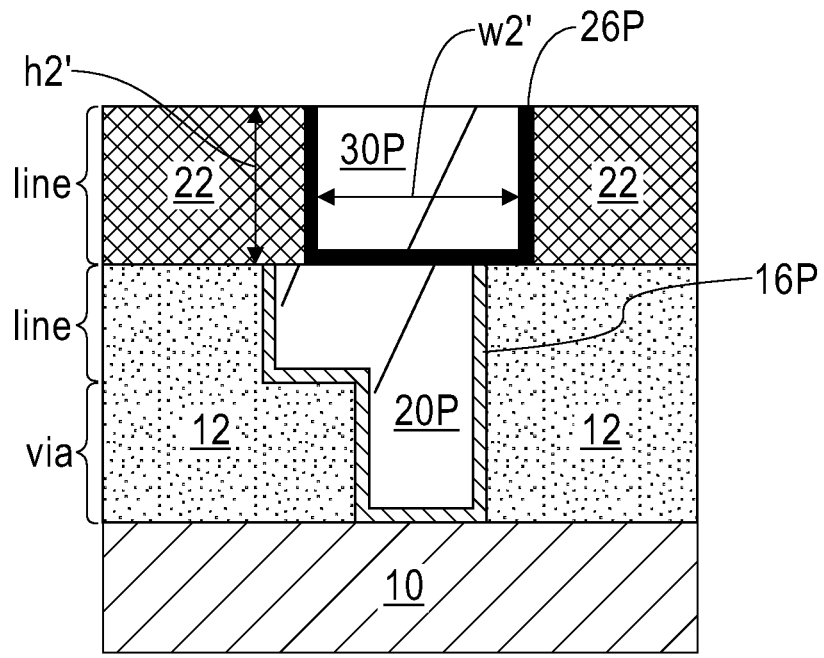
FIG. 10 is cross sectional view of the exemplary semiconductor structure of FIG. 9 after performing a planarization process.

Referring now to FIG. 10, there is illustrated the exemplary semiconductor structure of FIG. 9 after performing a planarization process. The planarization process may include chemical mechanical planarization and/or grinding. The planarization process removes all material that is present outside of the line opening 24 and located above the topmost surface of the second interconnect dielectric material layer 22.

The planarization process provides a line level interconnect structure 30P embedded in the second interconnect dielectric material layer 22. As is shown, the topmost surface of the line level interconnect structure 30P is coplanar with a topmost surface of the second interconnect dielectric material layer 22. The line level interconnect structure 30P is composed of a remaining portion of the second conductive metal or metal alloy having the bamboo microstructure mentioned above. The aspect ratio of the line level interconnect structure 30P, h2'/w2', is equal to or less than the original aspect ratio shown in FIG. 7A due to possible height loss during the planarization process.

In FIG. 10, element 26P denotes a remaining portion of the continuous layer of the second diffusion barrier material 26. The remaining portion of the continuous layer of the second diffusion barrier material 26 may be referred to as a second diffusion barrier liner 26P. The second diffusion barrier liner 26P continuously lines the line opening 24.

FIG. 10 illustrates an exemplary semiconductor structure of the present application. The semiconductor structure shown in FIG. 10 includes a combined via level/line level interconnect structure 20P embedded in the first interconnect dielectric material layer 12. The structure further includes a line level interconnect structure 30P embedded entirely in the second interconnect dielectric material layer 22 and located on at least a portion of the combined via level/line level interconnect structure 20P. The combined via level/line level interconnect structure 20P comprises a first conductive metal or metal alloy having a bamboo microstructure, and the line level interconnect structure 30P comprises a second conductive metal or metal alloy having a bamboo microstructure. Both line levels have an aspect ratio of less than 2.5. In this embodiment of the present application, portions of the first and second interconnect dielectric materials (12, 22) are in direct physical contact with each other. The exemplary semiconductor structure shown in FIG. 10 has a low resistivity of less than 7 micro-ohms-cm.

Figure 11:
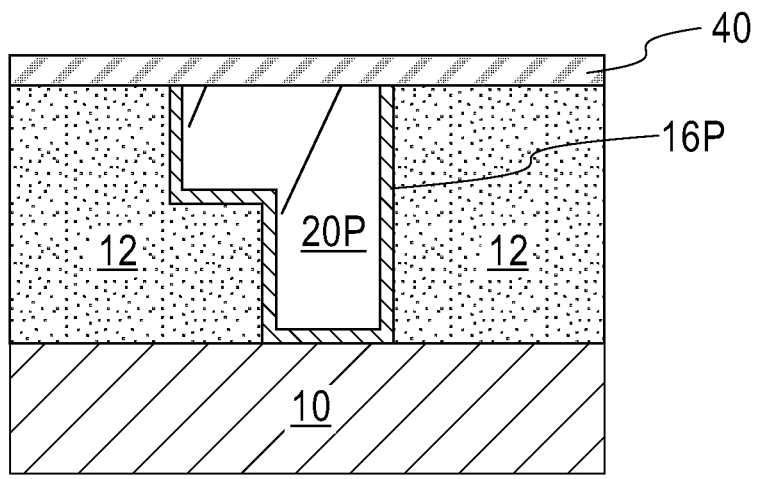
FIG. 11 is a cross sectional view of the exemplary semiconductor structure of FIG. 5 after forming a dielectric capping layer on the planarized semiconductor structure in accordance with another embodiment of the present application.

Referring now to FIG. 11, there is illustrated the exemplary semiconductor structure of FIG. 5 after forming a dielectric capping layer 40 on the planarized semiconductor structure in accordance with another embodiment of the present application. That is, the dielectric capping layer 40 is formed on exposed portions of the topmost surface of the first interconnect dielectric material layer 22, on exposed surfaces of the topmost surface of the first diffusion barrier liner 16P, and an exposed surface of the combined via level/line level interconnect structure 20P having the bamboo microstructure.

The dielectric capping layer 40 may include any suitable dielectric capping material such as, for example, SiC, $Si_4NH_3$, $SiO_2$, a carbon doped oxide, a nitrogen and hydrogen doped silicon carbide SiC(N,H) or multilayers thereof. The dielectric capping layer 40 can be formed utilizing a conventional deposition process such as, for example, chemical vapor deposition, plasma enhanced chemical vapor deposition, chemical solution deposition, evaporation, or atomic layer deposition. The thickness of the dielectric capping layer 40 may vary depending on the technique used to form the same as well as the material make-up of the layer. Typically, the dielectric capping layer 40 has a thickness from 15 nm to 100 nm. Other thicknesses that are lesser than, or greater than the aforementioned thickness range may also be employed as the thickness of the dielectric capping layer 40.

Figure 12:
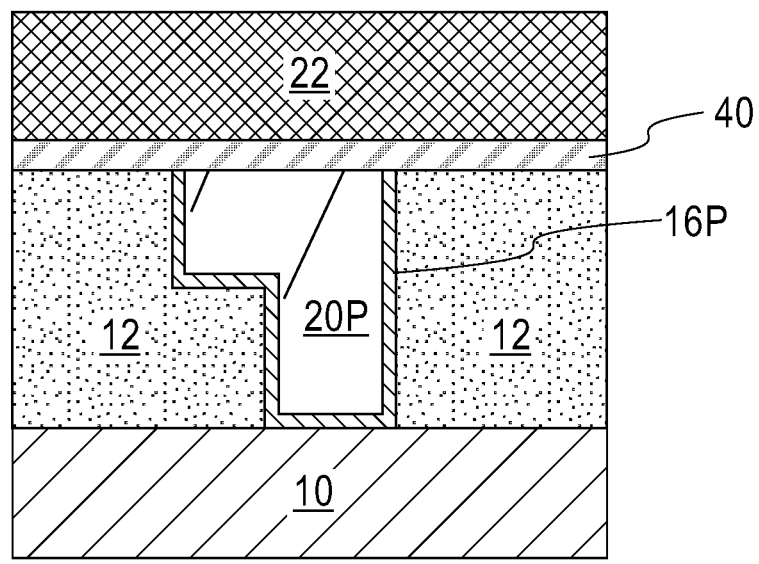
FIG. 12 is a cross sectional view of the exemplary semiconductor structure of FIG. 11 after forming a second interconnect dielectric material layer on the dielectric capping layer.

Referring now to FIG. 12, there is illustrated the exemplary semiconductor structure of FIG. 11 after forming a second interconnect dielectric material layer 22 on the dielectric capping layer 40. The second interconnect dielectric material 22 of this embodiment of the present is the same as mentioned above for the previous embodiment of the present application (See, the description above for the second interconnect dielectric material layer shown in FIG. 6). Thus, the materials, deposition processes and thickness mentioned above for the second interconnect dielectric material layer 22 apply equal well for this embodiment of the present application.

Figure 13A:
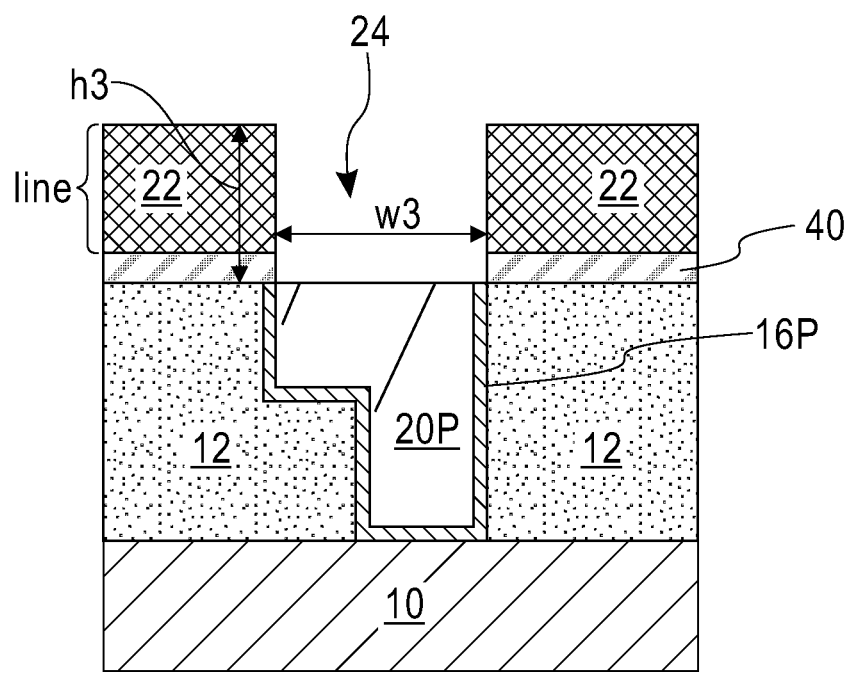
FIG. 13A is a cross sectional view of the exemplary semiconductor structure of FIG. 12 after forming a line opening in the second interconnect dielectric material layer and the dielectric capping layer in which the line opening is perfectly aligned to an underlying first conductive metal or metal alloy structure having the bamboo microstructure.
Figure 13B:
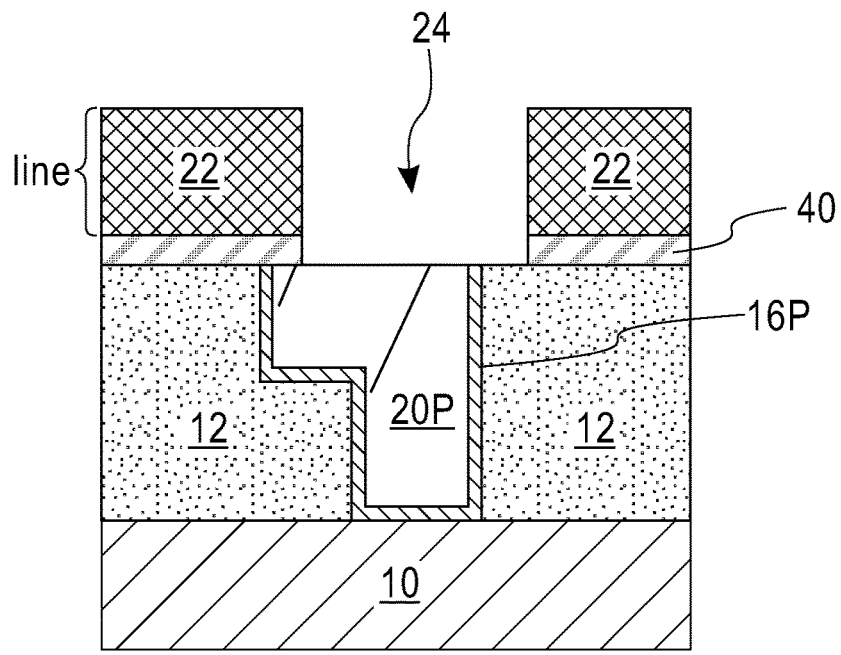
FIG. 13B is a cross sectional view of the exemplary semiconductor structure of FIG. 12 after forming a line opening in the second interconnect dielectric material layer and the dielectric capping layer in which the line opening is misaligned to an underlying first conductive metal or metal alloy structure having the bamboo microstructure.

Referring now to FIG. 13A, there is illustrated the exemplary semiconductor structure of FIG. 12 after forming a line opening 24 in the second interconnect dielectric material layer 22 and the dielectric capping layer 40 in which the line opening 24 is perfectly aligned to an underlying first conductive metal or metal alloy structure having the bamboo microstructure (i.e., the combined via level/line level interconnect structure 20P). FIG. 13B illustrates the exemplary semiconductor structure of FIG. 12 after forming a line opening 24 in the second interconnect dielectric material layer 22 and the dielectric capping layer 40 in which the line opening 24 is misaligned to an underlying first conductive metal or metal alloy structure having the bamboo microstructure (i.e., the combined via level/line level interconnect structure 20P).

In either embodiment, the line opening 24 has an aspect ratio (ratio of the third height, h3, to third width, w3) of less than 2.5; h3 is a combined thickness of the second interconnect dielectric material layer 22 and the dielectric capping layer 40. In one example, the aspect ratio of the line opening 24 is from 0.3 to 2.0. The line opening 24 can be formed by the patterning process mentioned above in forming the dual damascene opening 14 without a second iteration of lithography and etching.

Figure 14:
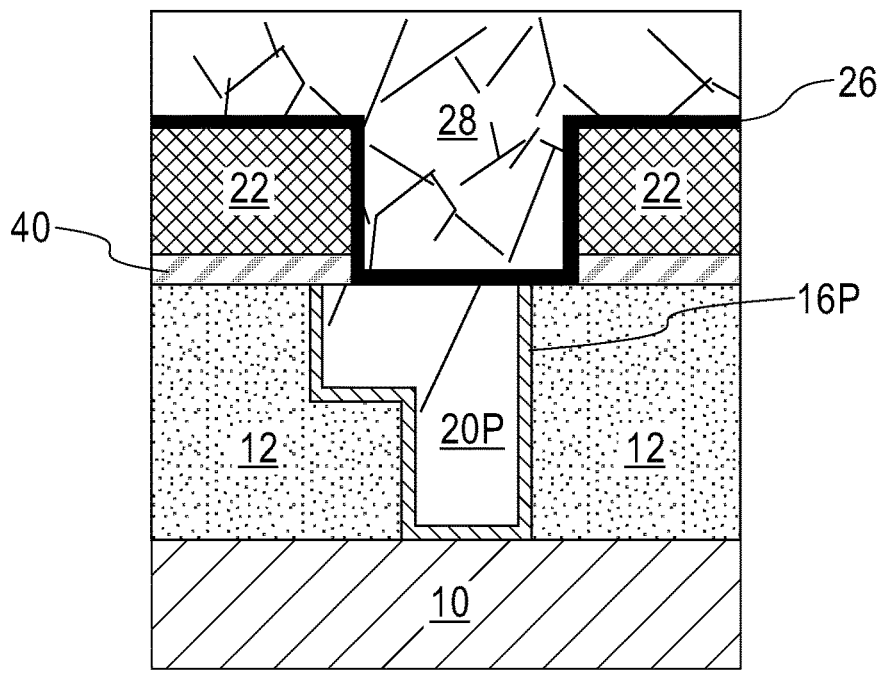
FIG. 14 is a cross sectional view of the exemplary semiconductor structure of FIG. 13B after forming a continuous layer of a second diffusion barrier material and a second conductive metal or metal alloy having a polycrystalline microstructure.

Referring now to FIG. 14, there is illustrated the exemplary semiconductor structure of FIG. 13B after forming a continuous layer of a second diffusion barrier material 26 and a second conductive metal or metal alloy having a polycrystalline microstructure; element 28 denotes the second conductive metal or metal alloy having the polycrystalline microstructure. The continuous layer of the second diffusion barrier material 26 and the second conductive metal or metal alloy having the polycrystalline microstructure are formed into the line opening 24 and above a topmost surface of the second interconnect dielectric material 22.

Although the continuous layer of the second diffusion barrier material 26 and the second conductive metal or metal alloy having the polycrystalline microstructure are shown as being formed on the exemplary semiconductor structure of FIG. 13B, the continuous layer of the second diffusion barrier material 26 and the second conductive metal or metal alloy having the polycrystalline microstructure can be formed on the exemplary semiconductor structure shown in FIG. 13A.

The continuous layer the second diffusion barrier material 26 and the second conductive metal or metal alloy having the polycrystalline microstructure are the same as described above in the previously embodiment of the present application. Thus, the materials, methods and thicknesses for the continuous layer the second diffusion barrier material 26 and the second conductive metal or metal alloy having the polycrystalline microstructure described above in the previous embodiment of the present application are applicable here for this embodiment of the present application.

Figure 15:
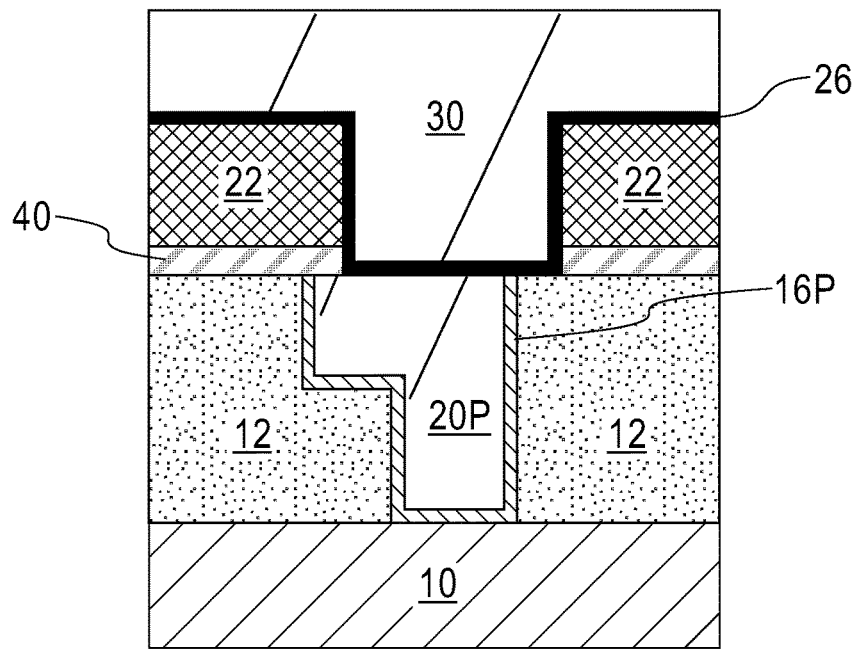
FIG. 15 is a cross sectional view of the exemplary semiconductor structure of FIG. 14 after performing an anneal to convert the polycrystalline microstructure of the second conductive metal or metal alloy into a bamboo microstructure.

Referring now to FIG. 15, there is illustrated the exemplary semiconductor structure of FIG. 14 after performing an anneal to convert the polycrystalline microstructure of the second conductive metal or metal alloy into a bamboo microstructure. In FIG. 15, element 30 denotes the second conductive metal or metal alloy that has the bamboo microstructure. The anneal used in this step of the present application may include one of the anneals (i.e., thermal or laser) mentioned above.

Figure 16:
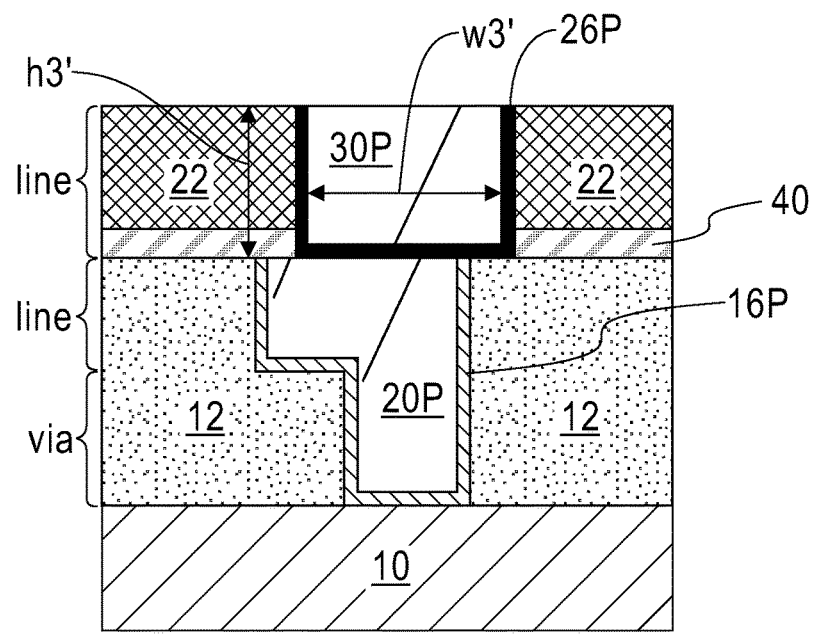
FIG. 16 is cross sectional view of the exemplary semiconductor structure of FIG. 15 after performing a planarization process.

Referring now to FIG. 16, there is illustrated the exemplary semiconductor structure of FIG. 15 after performing a planarization process. The planarization process may include chemical mechanical planarization and/or grinding. The planarization process removes all material that is present outside of the line opening 24 and located above the topmost surface of the second interconnect dielectric material layer 22. The aspect ratio of the line level interconnect structure 30P, h3'/w3', is equal to or less than the original aspect ratio shown in FIG. 13A due to possible height loss during the planarization process.

The planarization process provides a line level interconnect structure 30P embedded in the second interconnect dielectric material layer 22 as well as the dielectric capping layer 40. Notably, an upper portion of the line level interconnect structure 30P is embedded in the second interconnect dielectric material layer 22, while a bottom portion of the line level interconnect structure 30P is embedded in the dielectric capping layer 40. As is shown, the topmost surface of the line level interconnect structure 30P is coplanar with a topmost surface of the second interconnect dielectric material layer 22. The line level interconnect structure 30P is composed of a remaining portion of the second conductive metal or metal alloy having the bamboo microstructure mentioned above.

In FIG. 16, element 26P denotes a remaining portion of the continuous layer of the second diffusion barrier material 26. The remaining portion of the continuous layer of the second diffusion barrier material 26 may be referred to as a second diffusion barrier liner 26P. The second diffusion barrier liner 26P continuously lines the line opening 24.

FIG. 16 illustrates another exemplary semiconductor structure of the present application. The semiconductor structure shown in FIG. 16 includes a combined via level/line level interconnect structure 20P embedded in the first interconnect dielectric material layer 12. The structure further includes a line level interconnect structure 30P embedded partially in the second interconnect dielectric material layer 22 and partially in the dielectric capping layer 40. The line level interconnect structure 30P is located on at least a portion of the combined via level/line level interconnect structure 20P. The combined via level/line level interconnect structure 20P comprises a first conductive metal or metal alloy having a bamboo microstructure, and the line level interconnect structure 30P comprises a second conductive metal or metal alloy having a bamboo microstructure. Both line levels have an aspect ratio of less than 2.5. In this embodiment of the present application, portions of the first and second interconnect dielectric materials (12, 22) are separated from each other by the dielectric capping layer 40. The exemplary semiconductor structure shown in FIG. 16 has a low resistivity of less than 7 micro-ohms-cm.

Figure 17:
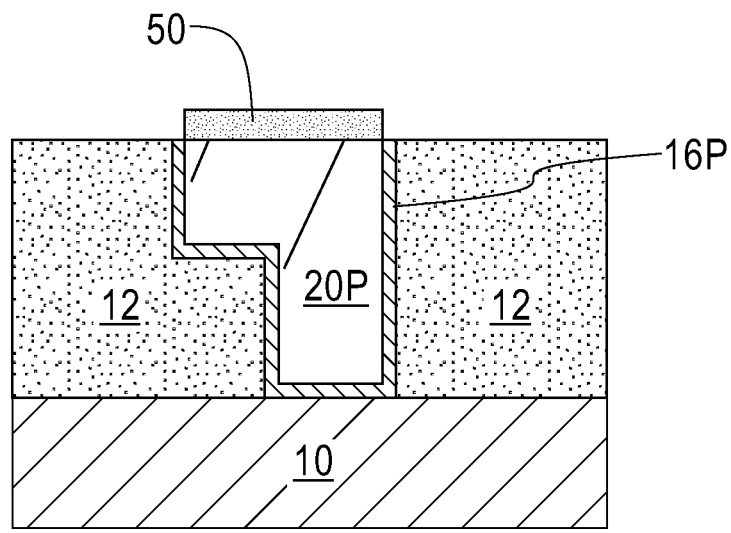
FIG. 17 is a cross sectional view of the exemplary semiconductor structure of FIG. 5 after forming a metallic capping layer on the first conductive metal or metal alloy structure having the bamboo microstructure in accordance with yet another embodiment of the present application.

Referring now to FIG. 17, there is illustrated the exemplary semiconductor structure of FIG. 5 after forming a metallic capping layer 50 on the first conductive metal or metal alloy structure having the bamboo microstructure (i.e., the combined via level/line level interconnect structure 20P) in accordance with another embodiment of the present application.

The metallic capping layer 50 is formed selectively on the topmost surface of the combined via level/line level interconnect structure 20P. Metallic capping layer 50 does not substantially extend onto the topmost surface of the first interconnect dielectric material layer 12. A portion of the metallic capping layer 50 may extend on the topmost surface of the first diffusion barrier liner 16P.

The metallic capping layer 50 may be formed by CVD, PECVD, ALD, plasma enhanced atomic layer deposition (PEALD), an electro plating process, or an electroless plating process. The metallic capping layer 50 can be composed of, for example, Co, Ru, Ir, Rh, Pt, Ta, W, Mn, or Mo, or an alloy comprising two or more of the foregoing metals. Typically, the metallic capping layer 50 has a thickness from about 1 nm to about 20 nm, with a thickness from about 2 nm to about 10 nm being more typical.

Figure 18:
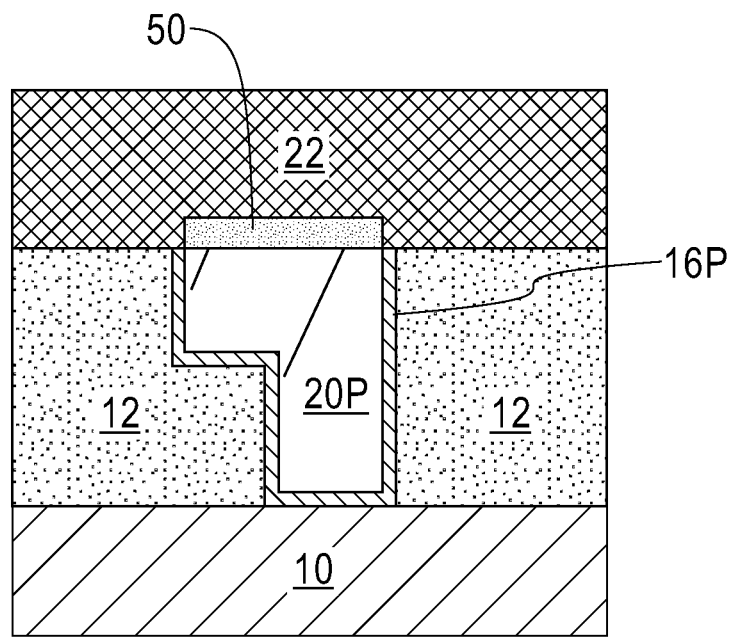
FIG. 18 is a cross sectional view of the exemplary semiconductor structure of FIG. 17 after forming a second interconnect dielectric material layer.

Referring now to FIG. 18, there is illustrated the exemplary semiconductor structure of FIG. 17 after forming a second interconnect dielectric material layer 22. In this embodiment of the present application, the second interconnect dielectric material layer 22 is formed on the exposed topmost surface of the first interconnect dielectric material layer 12 as well as the exposed surfaces of the metallic capping layer 50 so as to embedded the metallic capping layer 50 in a lower portion of the second interconnect dielectric material layer 22.

The second interconnect dielectric material layer 22 of this embodiment of the present is the same as mentioned above for the previous embodiment of the present application (See, the description above for the second interconnect dielectric material layer shown in FIG. 6). Thus, the materials, deposition processes and thicknesses mentioned above for the second interconnect dielectric material layer 22 apply equally well for this embodiment of the present application.

Figure 19A:
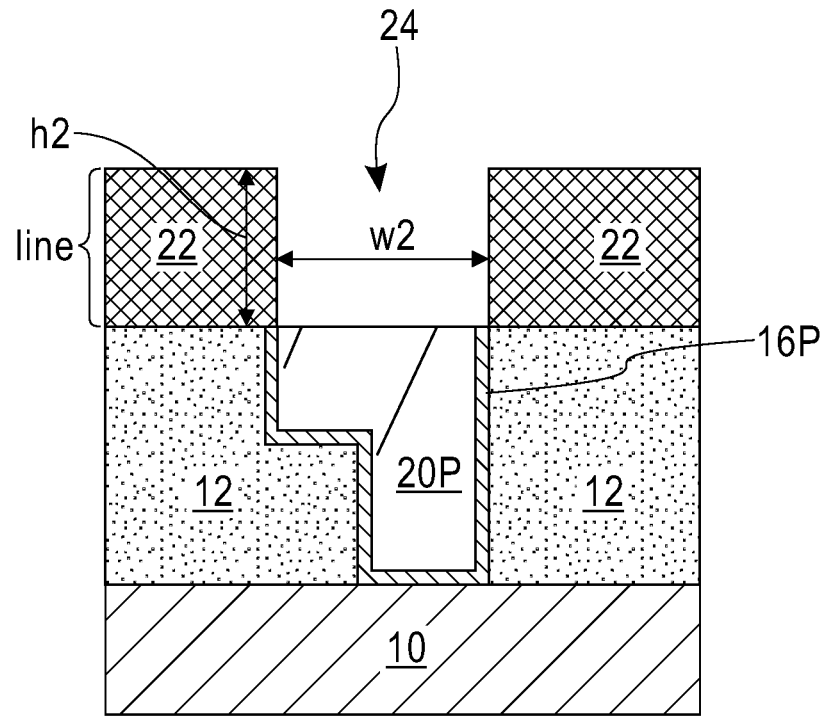
FIG. 19A is a cross sectional view of the exemplary semiconductor structure of FIG. 18 after forming a line opening in the second interconnect dielectric material layer and the metallic capping layer in which the line opening is perfectly aligned to an underlying first conductive metal or metal alloy structure having the bamboo microstructure.
Figure 19B:
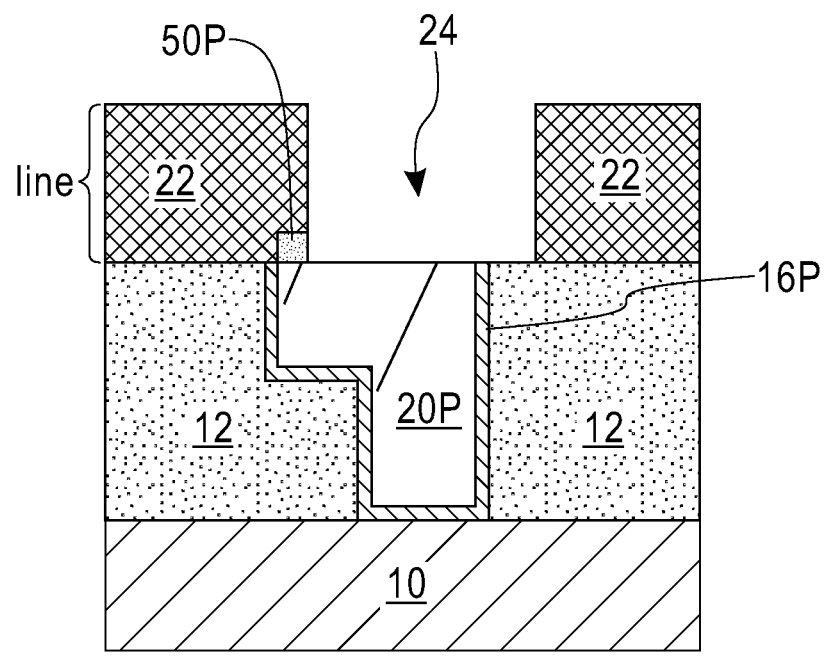
FIG. 19B is a cross sectional view of the exemplary semiconductor structure of FIG. 18 after forming an opening in the second interconnect dielectric material layer and the metallic capping layer in which the opening is misaligned to an underlying first conductive metal or metal alloy structure having the bamboo microstructure.

Referring now to FIG. 19A, there is illustrated the exemplary semiconductor structure of FIG. 18 after forming a line opening 24 in the second interconnect dielectric material layer 22 and the metallic capping layer 50 in which the line opening 24 is perfectly aligned to an underlying first conductive metal or metal alloy structure having the bamboo microstructure (i.e., the combined via level/line level interconnect structure 20P). In this embodiment, the formation of the line opening 24 completely removes the metallic capping layer 50 from the structure. FIG. 19B illustrated the exemplary semiconductor structure of FIG. 18 after forming a line opening 24 in the second interconnect dielectric material layer 22 and the metallic capping layer 50 in which the line opening 24 is misaligned to an underlying first conductive metal or metal alloy structure having the bamboo microstructure (i.e., the combined via level/line level interconnect structure 20P). In this embodiment, a portion of the metallic capping layer 50, designated as 50P in FIG. 19B, remains on the topmost surface of the combined via level/line level interconnect structure 20P.

In either embodiment, the line opening 24 has an aspect ratio (ratio of the second height, h2, to second width, w2) of less than 2.5. In one example, the aspect ratio of the line opening 24 is from 0.3 to 2.0. The line opening 24 can be formed by the patterning process mentioned above in forming the dual damascene opening 14 without a second iteration of lithography and etching.

Figure 20:
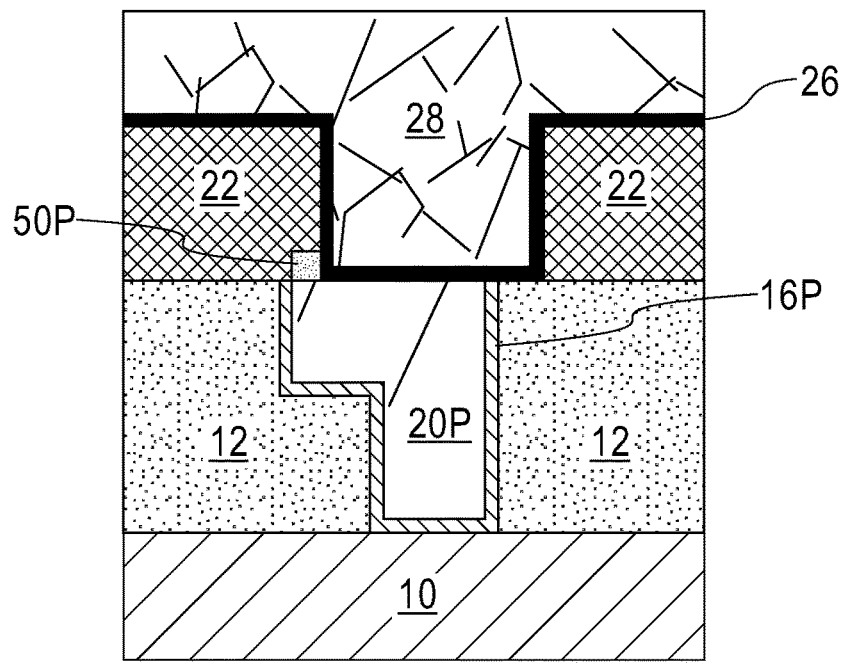
FIG. 20 is a cross sectional view of the exemplary semiconductor structure of FIG. 19B after forming a continuous layer of a second diffusion barrier material and a second conductive metal or metal alloy having a polycrystalline microstructure.

Referring now to FIG. 20, there is illustrated the exemplary semiconductor structure of FIG. 19B after forming a continuous layer of a second diffusion barrier material 26 and a second conductive metal or metal alloy having a polycrystalline microstructure; element 28 denotes the second conductive metal or metal alloy having the polycrystalline microstructure. The continuous layer of the second diffusion barrier material 26 and the second conductive metal or metal alloy having the polycrystalline microstructure are formed into the line opening 24 and above a topmost surface of the second interconnect dielectric material layer 22.

Although the continuous layer of the second diffusion barrier material 26 and the second conductive metal or metal alloy having the polycrystalline microstructure are shown as being formed on the exemplary semiconductor structure of FIG. 19B, the continuous layer of the second diffusion barrier material 26 and the second conductive metal or metal alloy having the polycrystalline microstructure can be formed on the exemplary semiconductor structure shown in FIG. 19A.

The continuous layer the second diffusion barrier material 26 and the second conductive metal or metal alloy having the polycrystalline microstructure are the same as described above in the first embodiment of the present application (See, for example, the description provided above for the continuous layer the second diffusion barrier material 26 and the second conductive metal or metal alloy having the polycrystalline microstructure provided for FIG. 3). Thus, the materials, methods and thicknesses for the continuous layer the second diffusion barrier material 26 and the second conductive metal or metal alloy having the polycrystalline microstructure described above are applicable here for this embodiment of the present application.

Figure 21:
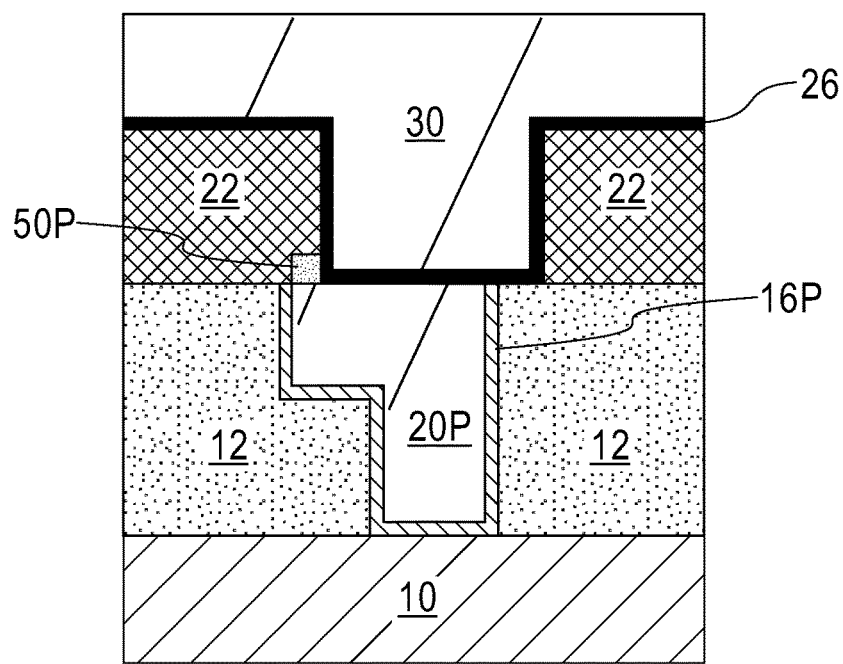
FIG. 21 is a cross sectional view of the exemplary semiconductor structure of FIG. 20 after performing an anneal to convert the polycrystalline microstructure of the second conductive metal or metal alloy into a bamboo microstructure.

Referring now to FIG. 21, there is illustrated the exemplary semiconductor structure of FIG. 20 after performing an anneal to convert the polycrystalline microstructure of the second conductive metal or metal alloy into a bamboo microstructure. In FIG. 21, element 30 denotes the second conductive metal or metal alloy that has the bamboo microstructure. The anneal used in this step of the present application may include one of the anneals (i.e., thermal or laser) mentioned above.

Figure 22:
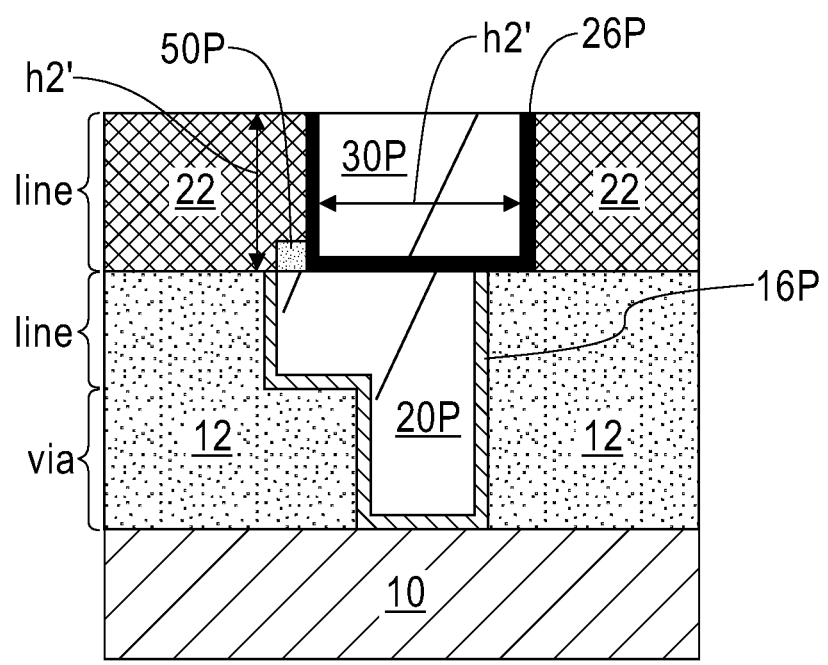
FIG. 22 is cross sectional view of the exemplary semiconductor structure of FIG. 21 after performing a planarization process.

Referring now to FIG. 22, there is illustrated the exemplary semiconductor structure of FIG. 21 after performing a planarization process. The planarization process may include chemical mechanical planarization and/or grinding. The planarization process removes all material that is present outside of the line opening 24 and located above the topmost surface of the second interconnect dielectric material layer 22. The aspect ratio of the line level interconnect structure 30P, h2'/w2', is equal to or less than the original aspect ratio shown in FIG. 19A due to possible height loss during the planarization process.

The planarization process provides a line level interconnect structure 30P embedded in the second interconnect dielectric material layer 22; a remaining portion of the metallic cap layer (i.e., metallic capping portion 50P) may be located adjacent one side of a bottom portion of the line level interconnect structure 30P. As is shown, the topmost surface of the line level interconnect structure 30P is coplanar with a topmost surface of the second interconnect dielectric material layer 22. The line level interconnect structure 30P is composed of a remaining portion of the second conductive metal or metal alloy having the bamboo microstructure mentioned above.

In FIG. 22, element 26P denotes a remaining portion of the continuous layer of the second diffusion barrier material 26. The remaining portion of the continuous layer of the second diffusion barrier material 26 may be referred to as a second diffusion barrier liner 26P. The second diffusion barrier liner 26P continuously lines the line opening 24.

FIG. 22 illustrates yet another exemplary semiconductor structure of the present application. The semiconductor structure shown in FIG. 21 includes a combined via level/line level interconnect structure 20P embedded in the first interconnect dielectric material layer 12. The structure further includes a line level interconnect structure 30P embedded in the second interconnect dielectric material layer 22.

The line level interconnect structure 30P is located on at least a portion of the combined via level/line level interconnect structure 20P. The combined via level/line level interconnect structure 20P comprises a first conductive metal or metal alloy having a bamboo microstructure, and the line level interconnect structure 30P comprises a second conductive metal or metal alloy having a bamboo microstructure. Both line levels have an aspect ratio of less than 2.5. In this embodiment of the present application, portions of the first and second interconnect dielectric materials 12, 22 are in direct physical contact with each other. The exemplary semiconductor structure shown in FIG. 16 has a low resistivity of less than 7 micro-ohms-cm.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a combined via level/line level interconnect structure embedded in a first interconnect dielectric material layer, wherein said combined via level/line level interconnect structure comprises a dual damascene opening containing, from bottom to top, a via opening and a line opening, wherein the via opening and the line opening are in direct contact with each other; and
   a line level interconnect structure embedded at least in part in a second interconnect dielectric material layer and located directly on at least a portion of said combined via level/line level interconnect structure, wherein said combined via level/line level interconnect structure further comprises a first conductive metal or metal alloy having a bamboo microstructure present in said via opening and line opening of said combined via level/line level interconnect structure, and said line level interconnect structure comprises a second conductive metal or metal alloy having a bamboo microstructure that is present in a line opening of said line level interconnect structure, wherein said line level interconnect structure is misaligned with said combined via level/line level interconnect structure, and wherein a metallic cap layer portion is located on a misaligned portion of said combined via level/line level interconnect structure and completely embedded in said second interconnect dielectric material, said metallic cap portion having a first side wall edge contacting a portion of said second interconnect dielectric material and a second side wall edge vertically aligned to a sidewall of said line opening in said second dielectric material layer and contacting said line level interconnect structure.

2. The semiconductor structure of claim 1, wherein said first and second interconnect dielectric material layers are in direct physical contact with each other.

3. The semiconductor structure of claim 1, wherein said combined via level/line level interconnect structure further includes a first diffusion barrier liner.

4. The semiconductor structure of claim 3, wherein said line level interconnect structure further includes a second diffusion barrier liner.

5. The semiconductor structure of claim 1, wherein said line level of said combined via level/line level interconnect structure has an aspect ratio of less than 2.5.

6. The semiconductor structure of claim 5, wherein said line level interconnect structure has an aspect ratio of less than 2.5.

7. A method of forming a semiconductor structure, said method comprising:
    forming a combined via level/line level interconnect structure embedded in a first interconnect dielectric material layer, wherein said combined via level/line level interconnect structure comprises a dual damascene opening containing, from bottom to top, a via opening and a line opening, wherein the via opening and the line opening are in direct contact with each other; and
    forming a line level interconnect structure embedded at least in part in a second interconnect dielectric material layer and located directly on at least a portion of said combined via level/line level interconnect structure, wherein said combined via level/line level interconnect structure further comprises a first conductive metal or metal alloy having a bamboo microstructure present in said via opening and line opening of said combined via level/line level interconnect structure, and said line level interconnect structure comprises a second conductive metal or metal alloy having a bamboo microstructure that is present in a line opening of said line level interconnect structure, wherein said line opening of said line level interconnect structure is misaligned to said line opening of said combined via level/line level interconnect structure, and wherein a metallic capping layer is formed on exposed surface of said combined via level/line level interconnect structure prior to said forming said second interconnect dielectric material, and wherein said forming said line opening of said line level interconnect structure removes at least a portion of said metallic capping layer to provide a metallic cap layer portion located on a misaligned portion of said combined via level/line level interconnect structure and completely embedded in said second interconnect dielectric material, said metallic cap portion having a first side wall edge contacting a portion of said second interconnect dielectric material and a second side wall edge vertically aligned to a sidewall of said line opening in said second dielectric material layer and contacting said line level interconnect structure.

8. The method of claim 7, wherein said forming said combined via level/line level interconnect structure embedded in said first interconnect dielectric material layer comprises:
    providing said first interconnect dielectric material layer on a surface of a substrate;
    forming said dual damascene opening in said first interconnect dielectric material layer;
    forming a first conductive metal or metal alloy having a polycrystalline microstructure in said dual damascene opening;
    annealing said first conductive metal or metal alloy to convert said polycrystalline microstructure of said first conductive metal or metal alloy into said bamboo microstructure; and
    planarizing said first conductive metal or metal alloy having said bamboo microstructure to provide said combined via level/line level interconnect structure.

9. The method of claim 8, further comprising:
    forming a continuous layer of a first diffusion barrier material in said dual damascene opening prior to said forming said first conductive metal or metal alloy having said polycrystalline microstructure, and wherein said planarizing removes a portion of said continuous layer of said first diffusion barrier material from a topmost surface of said first interconnect dielectric material layer.

10. The method of claim 7, wherein said forming said line level interconnect structure embedded in said second interconnect dielectric material layer comprises:
    providing said second interconnect dielectric material layer atop said first interconnect dielectric material layer containing said combined via level/line level interconnect structure;
    forming said line opening of said line level interconnect structure in said second interconnect dielectric material layer to expose a surface of said combined via level/line level interconnect structure;
    forming a second metal or metal alloy having a polycrystalline microstructure in said line opening;
    annealing said second conductive metal or metal alloy to convert said polycrystalline microstructure of said second conductive metal or metal alloy into said bamboo microstructure; and
    planarizing said second conductive metal or metal alloy having said bamboo microstructure to provide said line level interconnect structure.

11. The method of claim 10, further comprising:
    forming a continuous layer of a second diffusion barrier material in said line opening of said line level interconnect structure prior to said forming said second metal or metal alloy having said polycrystalline microstructure, and wherein said planarizing removes a portion of said continuous layer of said second diffusion barrier material from a topmost surface of said second interconnect dielectric material layer.

12. The method of claim 7, wherein said line level of said combined via level/line level interconnect structure has an aspect ratio of less than 2.5, and said line level interconnect structure has an aspect ratio of less than 2.5.

* * * * *